(12) United States Patent
Chee et al.

(10) Patent No.: US 9,165,869 B1
(45) Date of Patent: Oct. 20, 2015

(54) SEMICONDUCTOR DEVICE WITH TWISTED LEADS

(71) Applicants: Soo Choong Chee, Shah Alam (MY); Meng Kong Lye, Shah Alam (MY); Wai Keong Wong, Shah Alam (MY)

(72) Inventors: Soo Choong Chee, Shah Alam (MY); Meng Kong Lye, Shah Alam (MY); Wai Keong Wong, Shah Alam (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 4 days.

(21) Appl. No.: 14/328,713

(22) Filed: Jul. 11, 2014

(51) Int. Cl.
*H01L 23/495* (2006.01)

(52) U.S. Cl.
CPC .... *H01L 23/49555* (2013.01); *H01L 23/49517* (2013.01)

(58) Field of Classification Search
CPC ............... H01L 23/49555; H01L 23/49517
See application file for complete search history.

(56) References Cited

U.S. PATENT DOCUMENTS

| 4,766,478 A | 8/1988 | Dennis | |
| 5,830,782 A * | 11/1998 | Smith | H01L 21/4839 438/123 |
| 7,732,258 B2 * | 6/2010 | Kim | H01L 21/4821 257/E21.151 |
| 2001/0000032 A1 * | 3/2001 | Smith | H01L 21/4839 438/110 |
| 2004/0032011 A1 * | 2/2004 | Warner | H01F 17/0033 257/676 |
| 2004/0135645 A1 * | 7/2004 | Koyama | H03H 9/1021 331/158 |
| 2013/0158638 A1 | 6/2013 | Zhulati | |
| 2013/0249319 A1 * | 9/2013 | Cummings | H01L 31/02021 307/131 |

FOREIGN PATENT DOCUMENTS

| EP | 0146463 | 11/1988 |
| EP | 0644585 | 10/1995 |

* cited by examiner

*Primary Examiner* — Victor A Mandala
(74) *Attorney, Agent, or Firm* — Charles E. Bergere

(57) ABSTRACT

A lead frame for a semiconductor device has a die flag and leads that surround the die flag. In order to decrease the distance or spacing between inner lead ends and the die flag, which allows for short bond wires for connecting the inner lead ends to a die mounted on the die flag, at least some of the leads are twisted along their lengths to be angled with respect to a die-flag plane. The pitch between such twisted leads can be reduced without resulting in physical contact between adjacent leads, enabling the leads to extend further towards the die flag.

12 Claims, 2 Drawing Sheets

SEMICONDUCTOR DEVICE WITH TWISTED LEADS

BACKGROUND OF THE INVENTION

The present invention relates generally to semiconductor devices and, more particularly, to a semiconductor device with twisted leads.

FIG. 1A shows a portion of a conventional lead frame 100 with die flag 101 and leads 102. Each lead 102 extends from the periphery 103 of the lead frame 100 towards the die flag 101 and terminates at an inner lead end 104. That is, the inner lead end 104 is proximate the die flag 101.

The leads 102 extend as close as possible to the die flag 101 to reduce the length of bond wire that has to be used to connect the leads to a die mounted on the die flag. As can be seen in the cross-sections shown in FIGS. 1B-1D taken respectively along lines 1B-1B, 1C-1C, and 1D-1D of FIG. 1A, in order to extend the leads 102 closer to the die flag 101, the widths of the leads 102 decrease as they approach the die flag 101 in order to prevent physical contact between adjacent ones of the leads 102. However, the widths of the leads 102 can be decreased only so much and still be able to accommodate a secure wire bond. Thus, the extent that the leads 102 can be extended towards the die flag 101 is limited. In order to allow for shorter bond wires lengths, it would be advantageous to be able to move the inner lead ends 104 closer to the die flag 101.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

In certain embodiments of the present invention, one or more leads are twisted to enable at least some of the leads to extend near to the die flag. Extending leads closer to the die flag means that the length of bond wires used to connect those leads to a die mounted on the die flag can be decreased, which decreases the cost of bond wire used and improves the electrical characteristics of signals that traverse the bond wires. Twisting the leads permits the leads to be extended closer without decreasing the width of the leads and therefore preserving the ability to provide a secure bond for a bond wire.

In one embodiment of the invention, a lead frame comprises a die flag and a plurality of leads that surround the die flag and extend towards the die flag. At least one lead is a twisted lead, where an end of the lead is rotated longitudinally along at least some of its length.

Figure 1A:
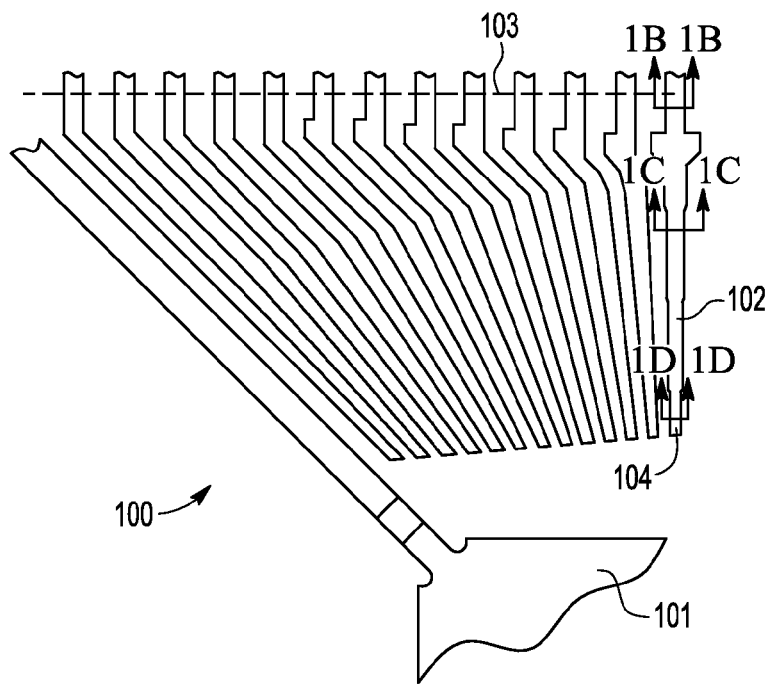
FIG. 1A is top plan view of part of a conventional lead frame.
Figure 1B:
FIG. 1B is a cross-sectional view of a lead of the lead frame shown in FIG. 1A taken along the line 1B-1B.
Figure 1C:
FIG. 1C is a cross-sectional view of a lead of the lead frame shown in FIG. 1A taken along the line 1C-1C.
Figure 1D:
FIG. 1D is a cross-sectional view of a lead of the lead frame shown in FIG. 1A taken along the line 1D-1D.
Figure 2A:
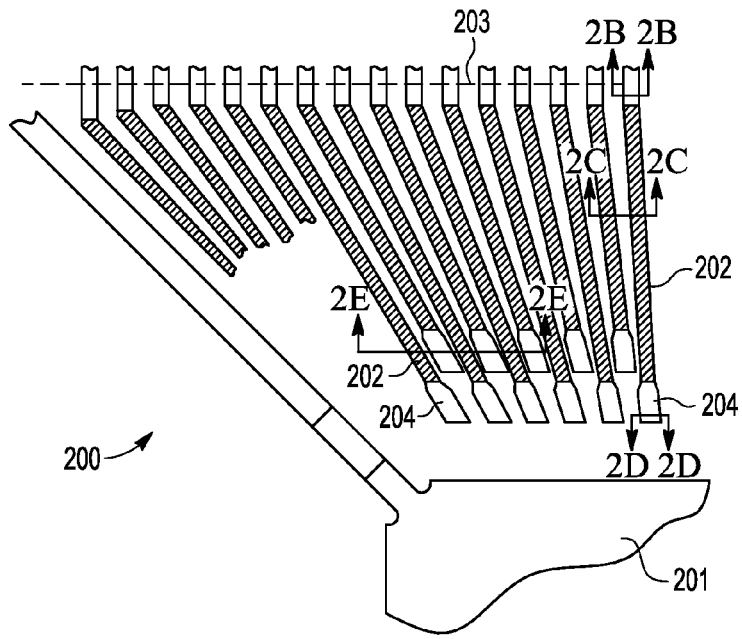
FIG. 2A is top plan view of part of a lead frame in accordance with an embodiment of the present invention.

Referring now to FIG. 2A, a top plan view of part of a lead frame 200 in accordance with an embodiment of the present invention is shown. The lead frame 200 includes a generally centrally located die flag 201 and a plurality of leads 202 that surround the die flag 201 and are generally perpendicular to the die flag 201. The leads 202 extend from a periphery 203 of the lead frame 200 towards the die flag 201. The leads 202 terminate at inner lead ends 204, which are proximate to the die flag 201. Bond wires may be attached to the inner lead ends 204 to connect the leads 202 to a die mounted on the die flag 201.

Along a portion of the length of at least some of the leads 202, the leads are twisted in order to decrease the distance (also known as "pitch") between the centers of adjacent leads 202 as they extend towards the die flag 201 without resulting in physical contact between the adjacent leads 202. By twisting the leads, which enables decreasing the pitch between adjacent leads, the leads are able to be extended further towards the die flag 201 without sacrificing the width of the leads and the available bonding area for bond wires.

By "twisted," "twisting," or "twists," it is meant that a lead rotates longitudinally along its length away from an orientation parallel to the plane defined by the die flag 201 to an angled orientation with respect to the die-flag plane along a first portion of the lead's length and then rotates back to a parallel orientation along a second portion of the lead's length. The leads 201 are again parallel with respect to the die-flag plane at their inner lead ends 204.

To form twisted leads, the leads are secured at the opposing end portions that are to remain parallel with respect to the die-flag plane and the intermediate portion of the leads are stamped along their lengths with an angled lead frame stamp. The angled lead frame stamp is angled at an angle with respect to the die-flag plane that is greater than the desired maximum angle at which the lead will ultimately be rotated with respect to the die-flag plane. By stamping the lead in this manner, the material properties of the lead (e.g., copper)

govern the rate of rotation that occurs along its length as the lead relaxes into a twisted state between the ends of the leads that were secured parallel with respect to the die-flag plane during the stamping procedure.

The stamping procedure for forming the twisted leads may be performed (i) as part of a multi-step stamping procedure where portions of the lead frame are first formed and then twisted or (ii) in some embodiments, in a single-step stamping procedure in which the twisted portions of the lead frame are formed and rotated simultaneously.

Figure 2B:
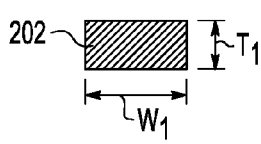
FIG. 2B is a cross-sectional view of a lead of the lead frame shown in FIG. 2A taken along the line 2B-2B.

FIG. 2B is a cross-sectional view of a lead 202 shown in FIG. 2A taken along the line 2B-2B. The cross-section is taken at a location on the lead 202 prior to the beginning of the twisting of the lead 202. The cross-sectional view shows that the lead 202 has a width $W_1$ that is wider than its thickness $T_1$. Having the thickness $T_1$ less than the width $W_1$ is preferable in forming the twisted lead 202, since this arrangement permits the lead 202 to twist without physically contacting adjacent leads as the leads extend further towards the die flag 201 and the pitch decreases.

Figure 2C:
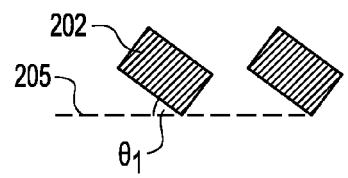
FIG. 2C is a cross-sectional view of two leads of the lead frame shown in FIG. 2A taken along the line 2C-2C.

FIG. 2C is a cross-sectional view of two leads 202 shown in FIG. 2A taken along the line 2C-2C. In FIG. 2C, the cross-section is taken at a location along the length of the leads 202 where the leads are twisted. The thickness and widths of the leads remain the same along the twisted portion of the leads. Here, the leads 202 are angled at an angle $\theta_1$ with respect to the die-flag plane. The angle $\theta_1$ is less than ninety degrees, and generally the angle with respect to the die-flag plane falls within the range of 0°-90°, and more preferably within the range of 30°-50°. The angle is a function of the distance along the length from the ends of the leads that are parallel with respect to the die-flag plane and is a result of the material properties of the lead as it is twisted between the opposing ends of the leads. The leads 202 are shown angled in a particular direction; however, it should be understood that adjacent leads may rotate in the opposite direction from that which is shown. Regardless of the chosen direction of rotation, all adjacent twisted leads should rotate in the same direction in order to prevent physical contact between them. In an alternative embodiment, the leads may be configured such that every other lead is twisted, while the remaining leads are untwisted.

Figure 2D:
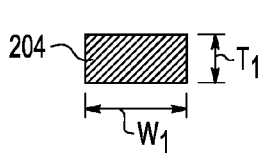
FIG. 2D is a cross-sectional view of an inner lead end of the lead frame shown in FIG. 2A taken along the line 2D-2D.

FIG. 2D is a cross-sectional view of an inner lead end 204 shown in FIG. 2A taken along the line 2D-2D. The width $W_1$ and thickness $T_1$ of the inner lead end 204 are equal to the width $W_1$ and thickness $T_1$ of the lead shown in FIG. 2A. By twisting the leads 202 and having them extend different distances towards the die flag 201, there is no need to decrease the dimensions of the inner lead ends 204.

Figure 2E:
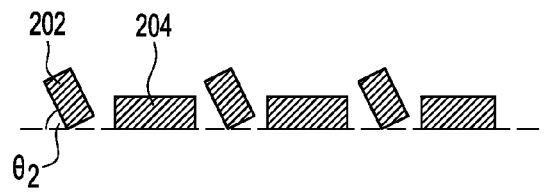
FIG. 2E is a cross-sectional view of three leads and three inner lead ends of the lead frame shown in FIG. 2A taken along the line 2E-2E.

FIG. 2E is a cross-sectional view of leads and lead ends shown in FIG. 2A taken along the line 2E-2E. In the embodiment shown in FIGS. 2A-2E, all of the leads 202 are twisted, with every other lead (arbitrarily referred to as "the odd leads") extending closer towards the die flag 201 than the remaining "even" leads, as shown in FIG. 2A. As indicated in FIG. 2A, the shorter, even leads de-rotate before the longer, odd leads do, such that, as shown in FIG. 2A, the shorter, even leads are parallel to the die-flag plane at their inner lead ends 204, while the longer, odd leads are still fully rotated. As shown in FIG. 2A, the longer, odd leads do not re-rotate until beyond the inner lead ends 204 of the shorter, even leads. This combination of leads having different lengths and different phasing of lead de-rotation enables leads having wide inner lead ends 204 to extend further towards the die flag 201 than conventional collections of un-twisted leads. Not only can the longer, odd leads extend further towards the die flag compared to conventional un-twisted leads, but so can the shorter, even leads.

In the embodiment shown in FIG. 2E, when the inner lead ends 204 of the shorter, even leads are parallel with respect to the die-flag plane, the longer, odd leads 202 have a rotation angle $\theta_2$. Angle $\theta_2$ should be such that the longer, odd leads 202 do not physically contact the inner lead ends 204 of the shorter, even leads 202. Angle $\theta_2$ may be the maximum rotation angle with respect to die-flag plane that the leads 202 achieve before returning to an untwisted state. In the embodiment shown, angle $\theta_2$ is greater than 30°, but less than 90°.

By using twisted leads, the leads can extend further towards the die flag, and the less bond wire has to be used in the manufacture of the semiconductor devices. Furthermore, the twisting of the leads permits the inner lead ends to retain their dimensions in order to provide sufficient area for the bond wire to be attached.

A lead frame is a collection of metal leads and possibly other elements (e.g., die paddles, power bars) that is used in semiconductor packaging for assembling a single packaged semiconductor device. Prior to assembly into a packaged device, a lead frame may have support structures (e.g., a rectangular metal frame) that keep those elements in place. During the assembly process, the support structures may be removed. As used herein, the term "lead frame" may be used to refer to the collection of elements before assembly or after assembly, regardless of the presence or absence of those support structures.

Although the invention has been described using relative terms such as "down," "out," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary.

Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A packaged semiconductor device, comprising:
   a die flag; and
   a plurality of leads extending towards the die flag, wherein at least one lead is a twisted lead that rotates longitudinally along at least part of its length.

2. The semiconductor device of claim 1, wherein:
   each end of the twisted lead is non-rotated; and
   along its intermediate length, the twisted lead rotates along a first portion of the intermediate length from one non-rotated end to a maximum rotation angle, and then de-rotates back to the other non-rotated end along a second portion of the intermediate length.

3. The semiconductor device of claim 2, wherein the twisted lead remains rotated at the maximum rotation angle along a third portion of the intermediate length between the first and second portions.

4. The semiconductor device of claim 2, wherein the maximum rotation angle is less than 90 degrees.

5. The semiconductor device of claim 4, wherein the maximum rotation angle is greater than 30 degrees.

6. The semiconductor device of claim 1, wherein the twisted lead has a width greater than its thickness, such that a pitch between the twisted lead and an adjacent lead is capable of being smaller than a pitch between two non-twisted leads without physical contact between the twisted lead and the adjacent lead.

7. The semiconductor device of claim 6, wherein the twisted lead has constant width and thickness along its length.

8. The semiconductor device of claim 1, wherein the plurality of leads are twisted leads.

9. The semiconductor device of claim 8, wherein:
   a first subset of the twisted leads extend further towards the die flag than a second subset of the twisted leads; and
   the twisted leads of the first subset are interleaved with the twisted leads of the second subset.

10. The semiconductor device of claim 9, wherein:
    the twisted leads of the second subset de-rotate at locations at which the twisted leads of the first subset remain twisted; and
    the twisted leads of the first subset de-rotate at locations beyond the lengths of the twisted leads of the second subset.

11. The semiconductor device of claim 1, further comprising:
    a die mounted on the die flag; and
    bond wires electrically connecting the die to the leads.

12. A lead frame for a semiconductor device, comprising:
    a die flag; and
    a plurality of leads extending towards the die flag, wherein at least one lead is a twisted lead that rotates longitudinally along at least part of its length.

* * * * *